United States Patent
Chen et al.

(10) Patent No.: US 8,461,053 B2
(45) Date of Patent: Jun. 11, 2013

(54) SELF-ALIGNED NAND FLASH SELECT-GATE WORDLINES FOR SPACER DOUBLE PATTERNING

(75) Inventors: Tung-Sheng Chen, Cupertino, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 284 days.

(21) Appl. No.: 12/971,818

(22) Filed: Dec. 17, 2010

(65) Prior Publication Data

US 2012/0156876 A1 Jun. 21, 2012

(51) Int. Cl.
*H01L 21/302* (2006.01)

(52) U.S. Cl.
USPC ........... 438/736; 438/717; 438/725; 438/742; 216/47

(58) Field of Classification Search
USPC .... 438/639, 717, 718, 723, 724, 736; 216/41, 216/47; 430/312, 313
See application file for complete search history.

(56) References Cited

U.S. PATENT DOCUMENTS

| | | | |
|---|---|---|---|
| 7,727,889 B2 * | 6/2010 | Choi et al. | 438/669 |
| 2007/0210449 A1 * | 9/2007 | Caspary et al. | 257/734 |
| 2009/0263749 A1 | 10/2009 | Sim et al. | |
| 2009/0269924 A1 | 10/2009 | Choi et al. | |
| 2010/0105210 A1 * | 4/2010 | Chen et al. | 438/702 |
| 2010/0173492 A1 * | 7/2010 | Kim et al. | 438/689 |
| 2010/0184287 A1 * | 7/2010 | Eom | 438/669 |
| 2010/0297852 A1 | 11/2010 | Jung et al. | |

* cited by examiner

*Primary Examiner* — Lan Vinh

(57) ABSTRACT

A method for double patterning is disclosed. In one embodiment the formation a pair of select gate wordlines on either side of a plurality of core wordlines begins by placing a spacer pattern around edges of a photoresist pattern is disclosed. The photoresist pattern is stripped away leaving the spacer pattern. A trim mask is placed over a portion of the spacer pattern. Portions of the spacer pattern are etched away that are not covered by the trim mask. The trim mask is removed, wherein first remaining portions of the spacer pattern define a plurality of core wordlines. A pad mask is placed such that the pad mask and second remaining portions of the spacer pattern define a select gate wordline on either side of the plurality of core wordlines. Finally at least one pattern transfer layer is etched through using the mad mask and the first and second remaining portions of the spacer pattern to etch the select gate wordlines and the plurality of core wordlines into a poly silicon layer.

15 Claims, 19 Drawing Sheets

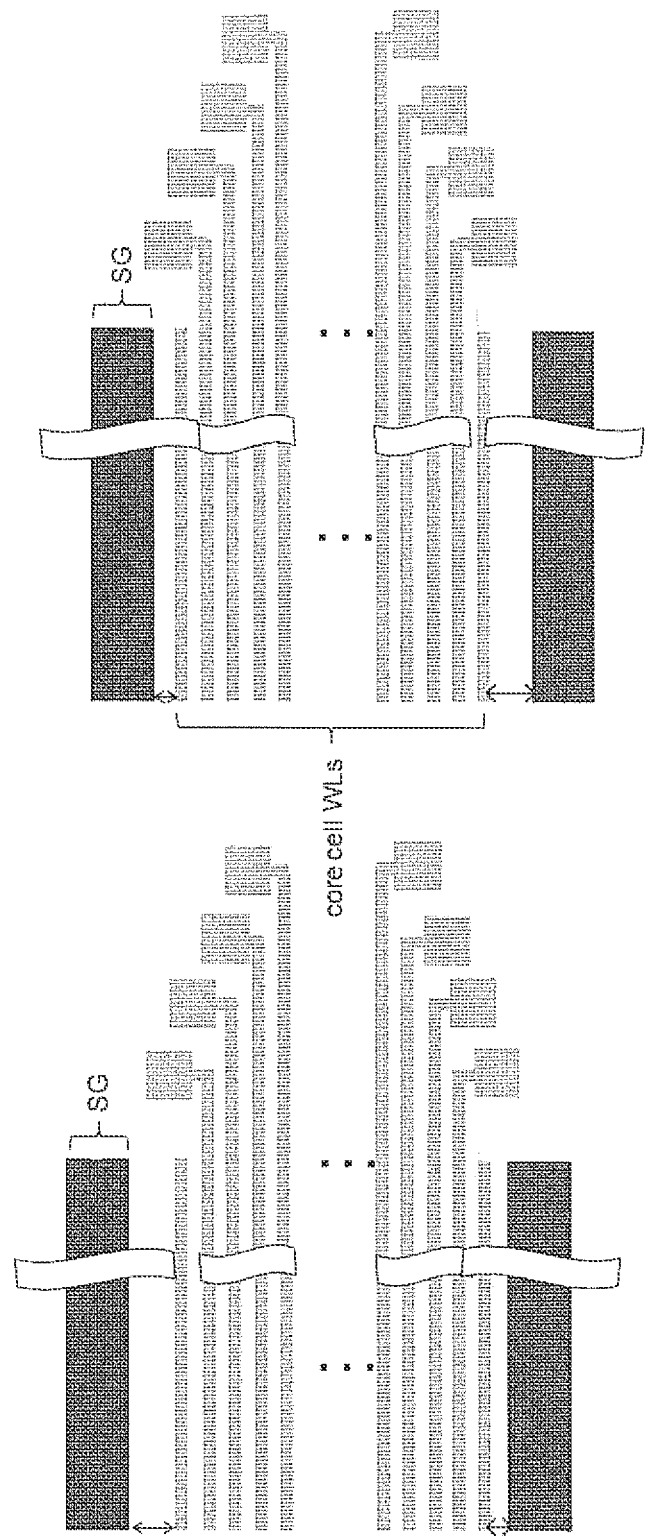

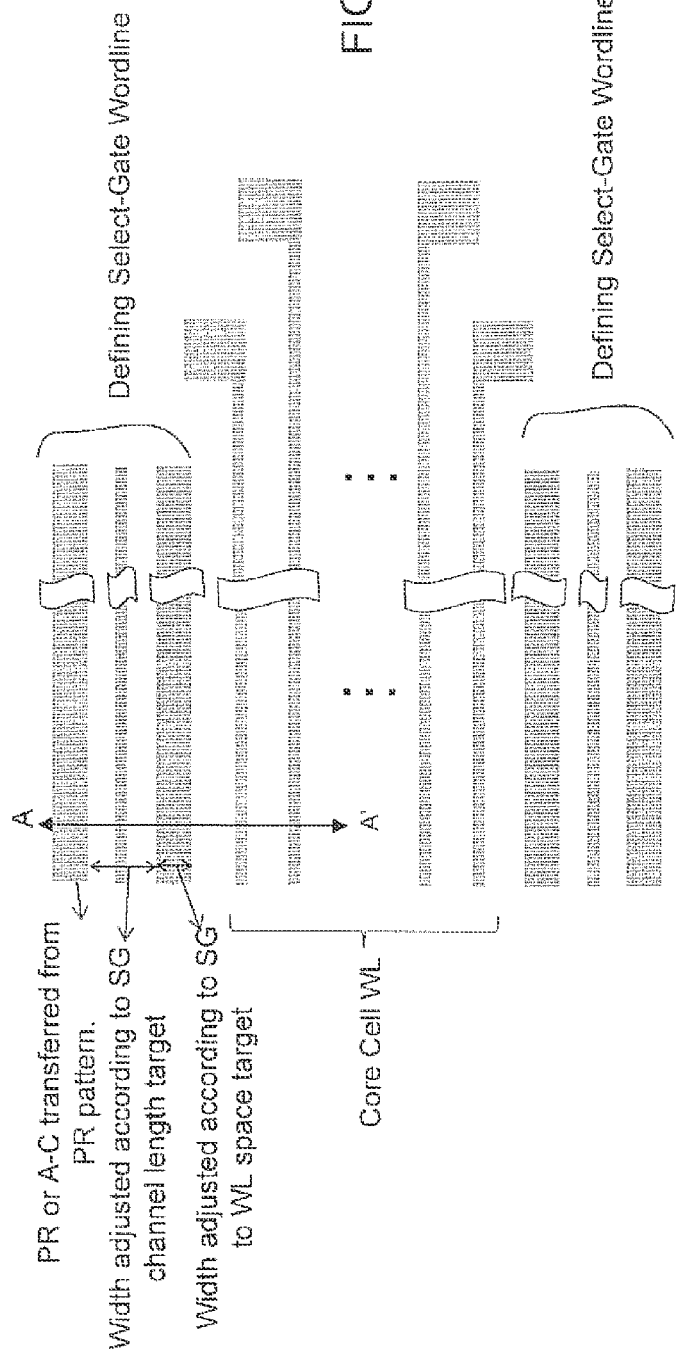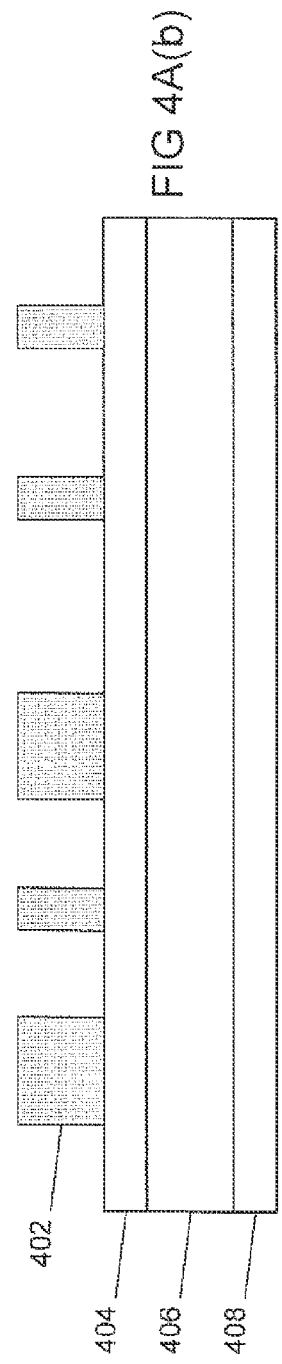

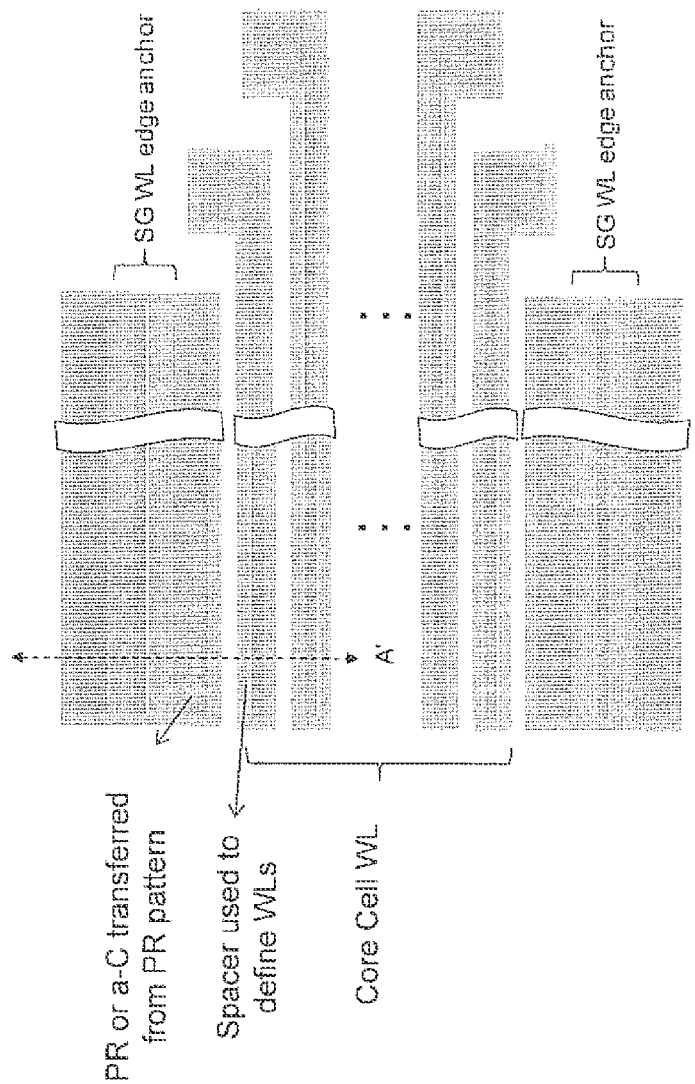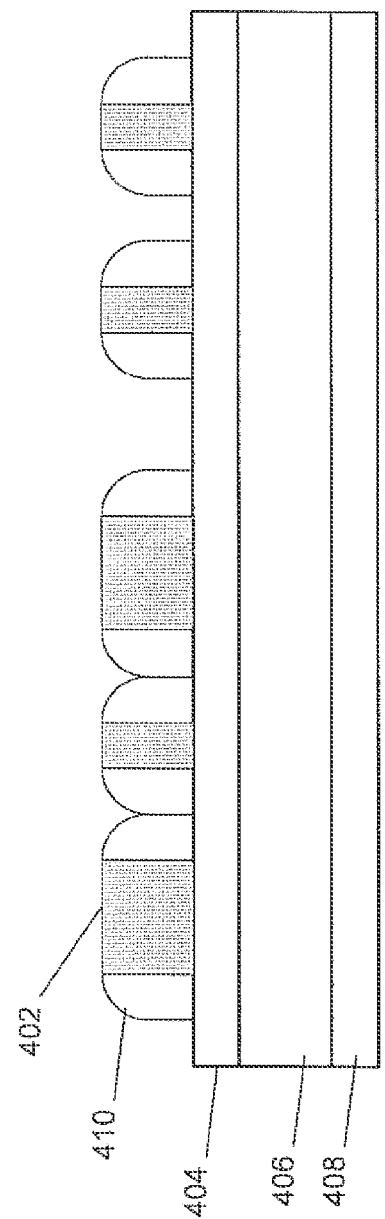

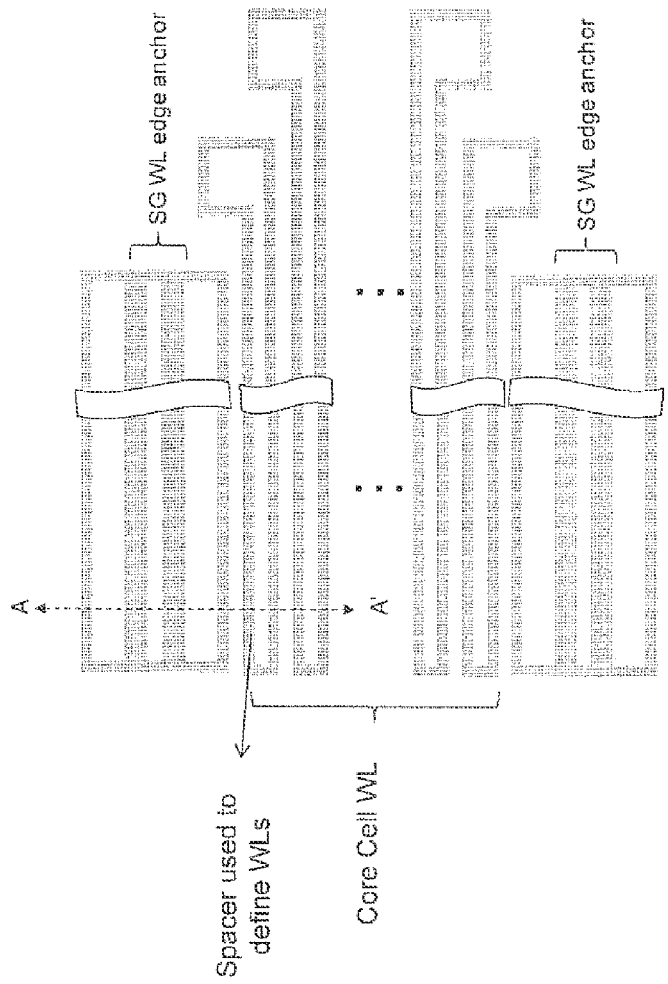
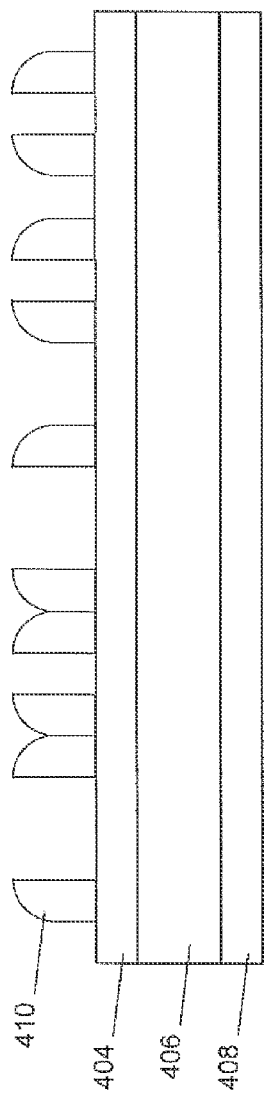
FIG 4C(a)
FIG 4C(b)

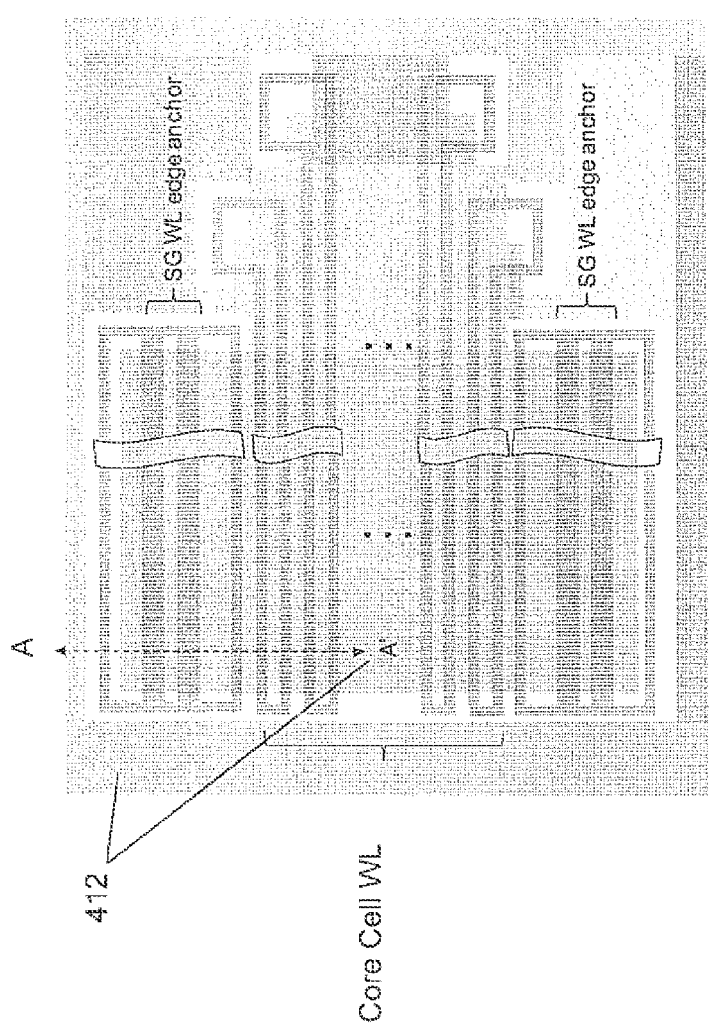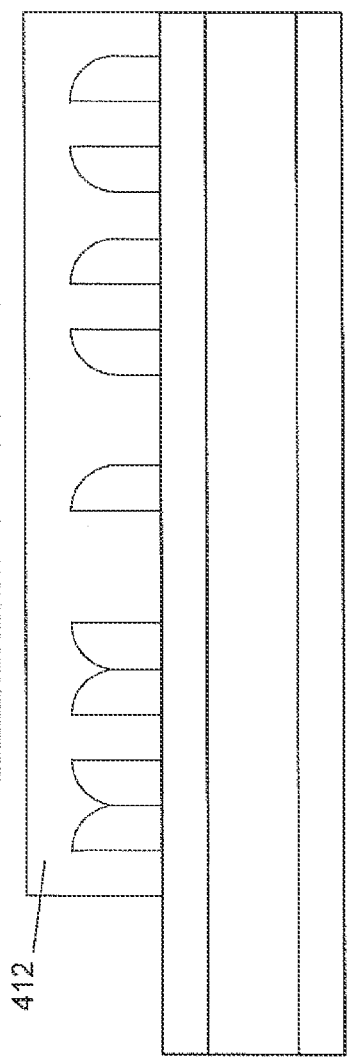

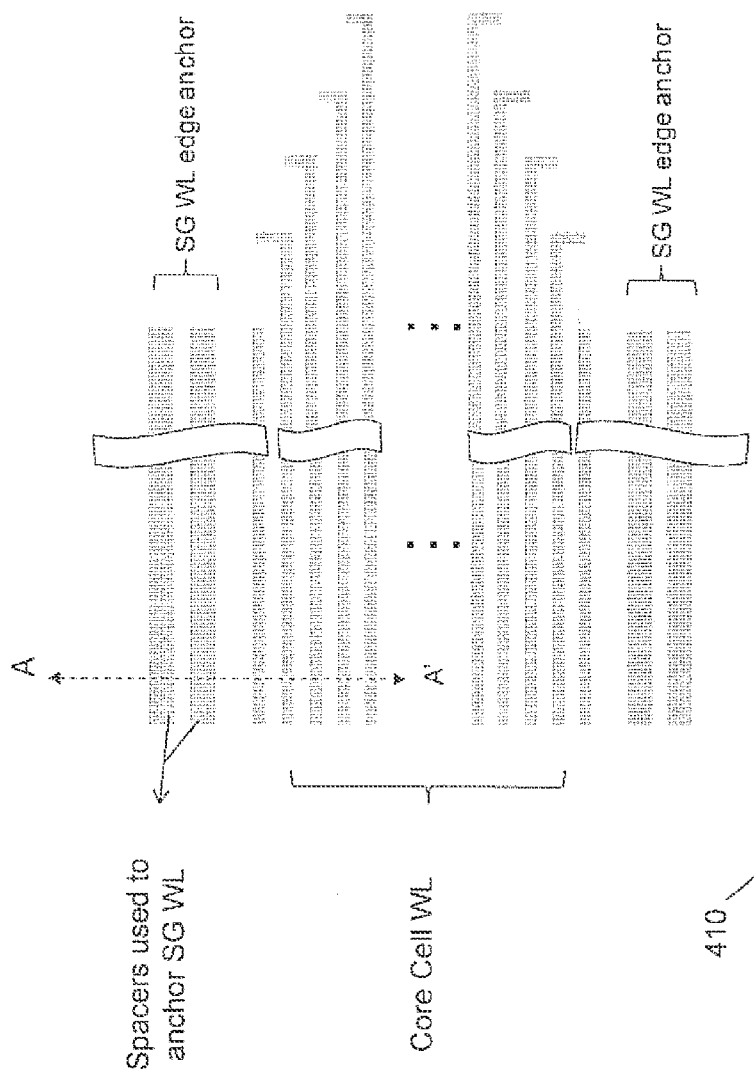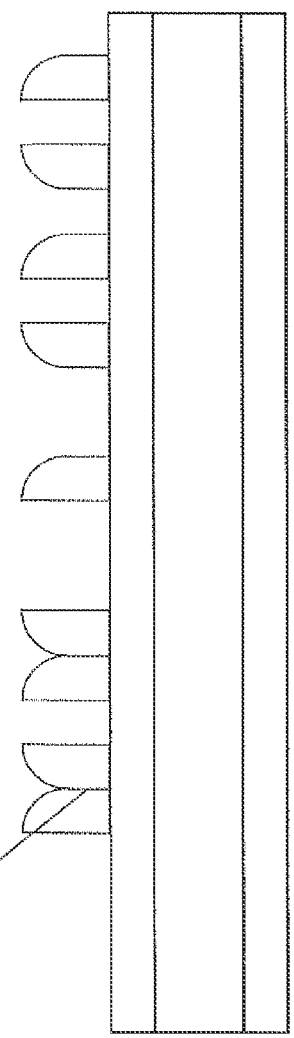

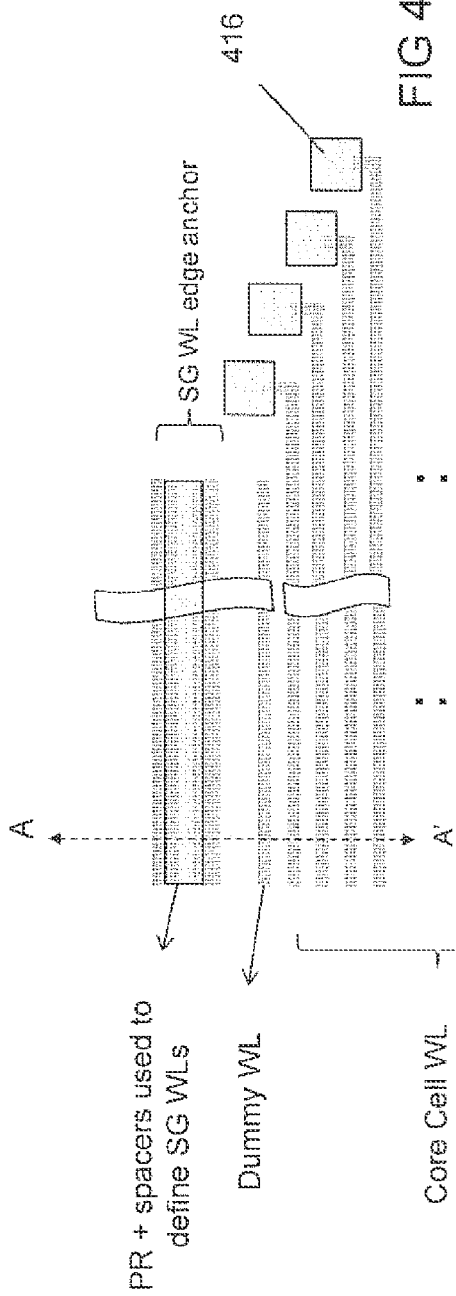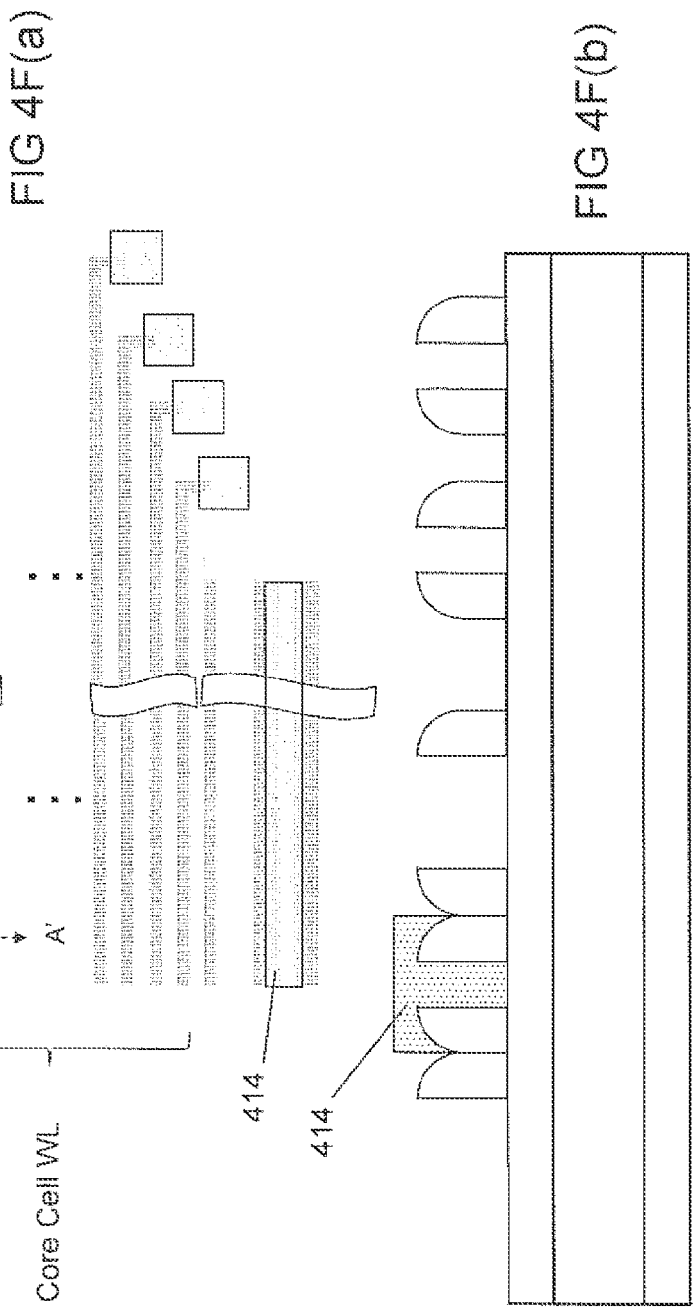

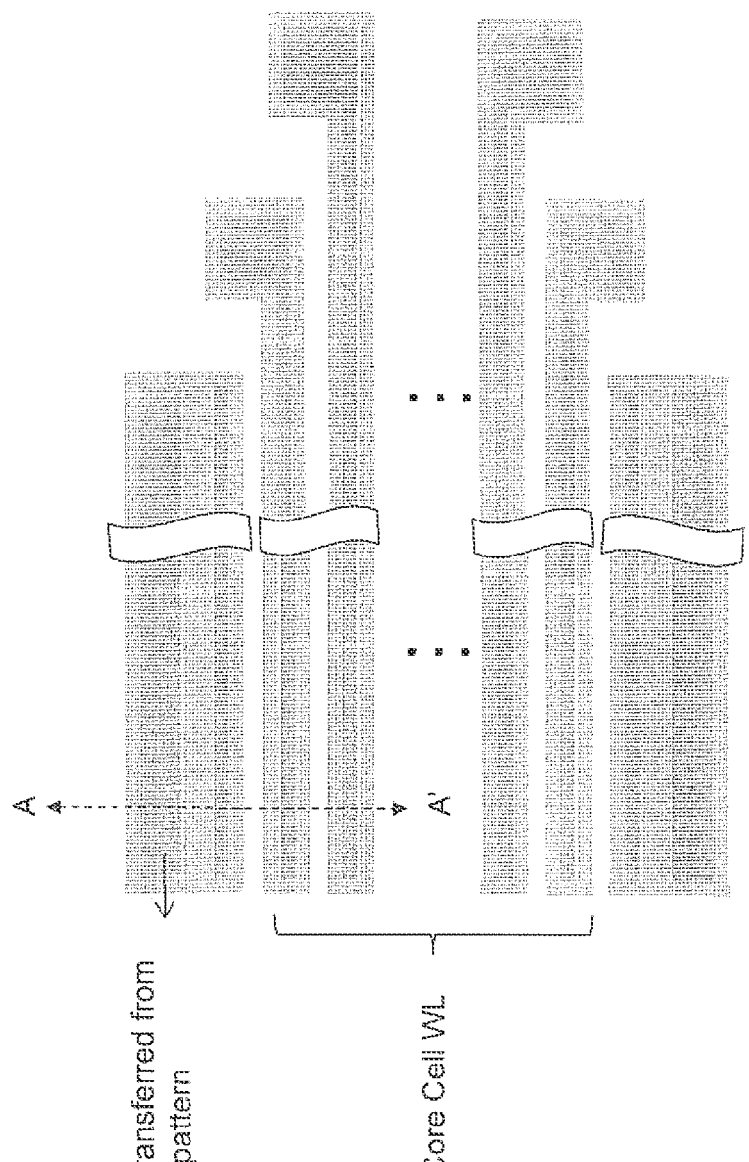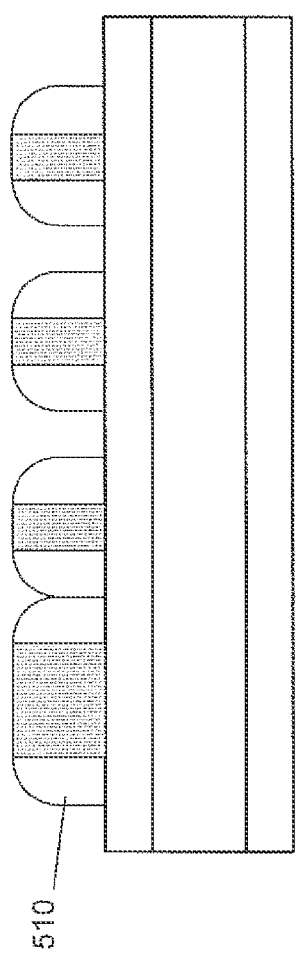

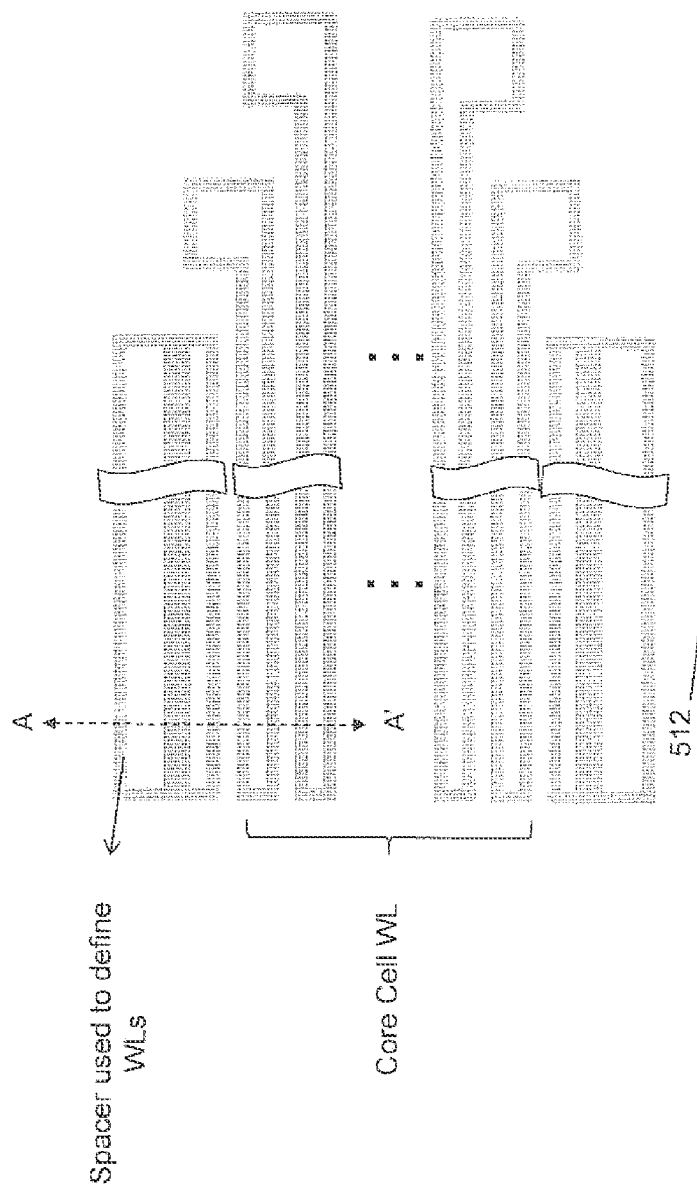
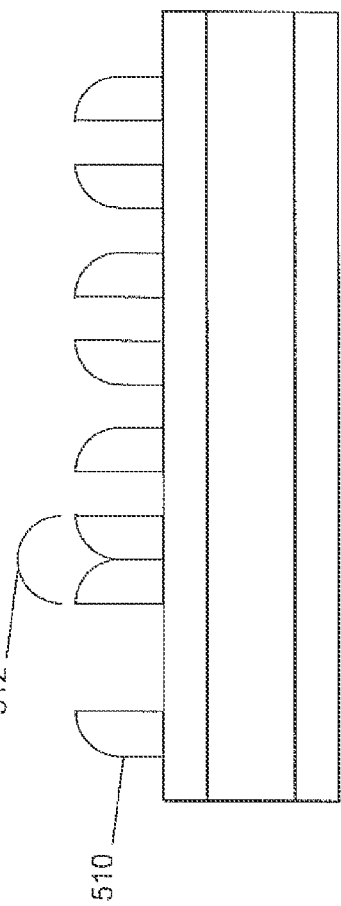
FIG 5C(a)
FIG 5C(b)

Core Cell WL

SELF-ALIGNED NAND FLASH SELECT-GATE WORDLINES FOR SPACER DOUBLE PATTERNING

TECHNICAL FIELD

The present disclosure relates generally to the field of semiconductor manufacturing and more specifically to the field of double patterning for self-aligned select-gate wordlines and core cell wordlines.

BACKGROUND

The trend in the semiconductor industry today is the production of ever increasingly more capable semiconductor components, while decreasing component size. Double patterning methods are popular methods to realize increased semiconductor device density. Double patterning methods allow the formation of structures smaller than a current generation's pitch width. With the need to achieve ever smaller feature sizes and thinner feature heights being an ongoing driver, new methodologies are sought.

Positive tone and negative tone double patterning techniques are available for achieving increased semiconductor device density. FIGS. 1A-1C illustrate a cross-sectional view of steps in forming a semiconductor pattern using positive tone double patterning. As illustrated in FIG. 1A, a photoresist layer is patterned into a photoresist pattern 102. The photoresist pattern 102 overlays at least one pattern transfer layer. In one embodiment, as illustrated in FIG. 1A, the photoresist pattern 102 overlays a silicon oxynitride layer 104 and a hard mask layer 106. In another embodiment additional pattern transfer layers are utilized. The hard mask layer 106 is used when etching the final pattern into a final layer 108, such as poly-oxide.

FIG. 1B illustrates the placement of spacers 110 around the edges of the photoresist pattern 102. As illustrated in FIG. 1C, the remaining photoresist 102 is removed, leaving behind the spacer material to form a spacer pattern 110. As further illustrated in FIG. 1C, the spacer pattern is used as a template to etch a final pattern 112 into the hard mask layer 106, that is then used to etch the target layer 108.

FIGS. 2A-2E illustrate a cross-sectional view of steps in forming a semiconductor pattern using negative tone double patterning. Similar to FIGS. 1A and 1B, in FIGS. 2A and 2B, a photoresist layer 202 is formed over a plurality of pattern transfer layers, such as a silicon oxynitride layer 204 and a hard mask layer 206, which are over the target layer 208. As illustrated in FIG. 2B, spacers 210 are placed around the edges of the photoresist pattern 202. As illustrated in FIG. 2C, the remaining photoresist 202 is removed, leaving behind the spacer material to form a spacer pattern 210.

FIG. 2D illustrates the application of a spin-on-carbon (SOC) layer 212 over the spacer pattern 210. In one embodiment, the SOC layer 212 is applied to the entire wafer. As illustrated in FIG. 2E, the spacer pattern 210 is etched away leaving the SOC layer 212 as an SOC pattern layer 212. As further illustrated in FIG. 2E, the SOC pattern layer 212 is etched to form a final pattern 214 that is etched into the target layer 208.

FIG. 3 illustrates a pair of top-down layouts of a semiconductor device comprising a pair of select-gate wordlines and a plurality of core cell wordlines. As illustrated in FIG. 3, when the select-gate wordlines and core cell wordlines are patterned, the spacing between a select-gate wordline and a nearest core cell wordline may vary. This inconsistency in select-gate wordline placement leads to a number of well known difficulties in semiconductor device operation. If the spacing between the select-gate wordlines and the edge core cell wordlines is off, the boosting voltage will be off. Further, a small space from select gate to edge cell will result in interference. The core cell operation, controlled by the two select-gates, is affected by their spacing dimensions to the select gate. Such problems with varying lateral spacing dimensions become more problematic as the pitch continues to diminish. For example, the problem becomes quite severe in 32 nm structures. For example, even small differences in lateral dimensions can result in a select gate being laid so that it overlays the first core cell wordline, effectively resulting in high junction leakage or a dead cell.

SUMMARY OF THE INVENTION

This present invention provides a solution to the challenges inherent in producing high density semiconductor devices with reduced pitch using double patterning techniques. In a method according to one embodiment of the present invention, a process using double patterning to produce a self-aligned select-gate wordline is disclosed. The method begins by placing a spacer pattern around edges of a photoresist pattern. Then the photoresist pattern is stripped away, leaving the spacer pattern. Now a trim mask is placed over a portion of the spacer pattern. Then, portions of the spacer pattern are etched away that are not covered by the trim mask. The trim mask is removed, wherein remaining portions of the spacer pattern define a plurality of core wordlines. A pad mask is placed such that the pad mask and remaining portions of the spacer pattern define a select-gate wordline on either side of the plurality of core cell wordlines. Finally, at least one pattern transfer layer is etched through using the pad mask and the remaining portions of the spacer pattern to etch the select-gate wordlines and the plurality of core cell wordlines into a polyoxide layer.

In another method according to a further embodiment of the present invention, a process using double patterning to produce a self-aligned select-gate wordline is disclosed. The method begins by placing a spacer pattern around edges of a photoresist pattern. The photoresist pattern is stripped away, leaving the spacer pattern. Now a spin-on-carbon (SOC) layer is placed over the spacer pattern. The spacer pattern is now etched away, such that the SOC layer remains to form an SOC pattern. A trim mask is placed over a portion of the SOC pattern. Now portions of the SOC pattern not covered by the trim mask are etched away. Then the trim mask is removed, such that the remaining portions of the SOC pattern define a plurality of core cell wordlines, a select-gate wordline on either side of the plurality of core cell wordlines and a dummy wordline between each of the select-gate wordlines and the plurality of core cell wordlines. Finally at least one pattern transfer layer is etched through, using the SOC pattern to etch the select-gate wordlines, the dummy wordlines, and the plurality of core cell wordlines into a polyoxide layer.

BRIEF DESCRIPTION OF THE DRAWINGS

The present invention will be better understood from a reading of the following detailed description, taken in conjunction with the accompanying drawing figures in which like reference characters designate like elements and in which:

FIG. 3 illustrates a schematic top-down layout of a semiconductor according to the prior art exhibiting select gate wordline and core cell wordline spacing;

DETAILED DESCRIPTION

Figure 1A:
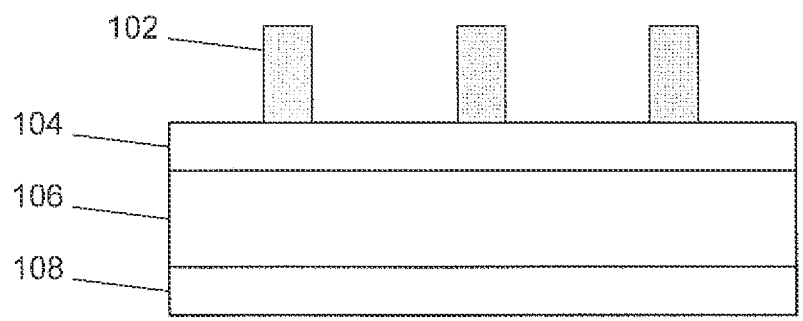
FIGS. 1A-1C illustrate schematic cross-sections of a semiconductor device according to the prior art exhibiting steps for positive tone double patterning.
Figure 1B:
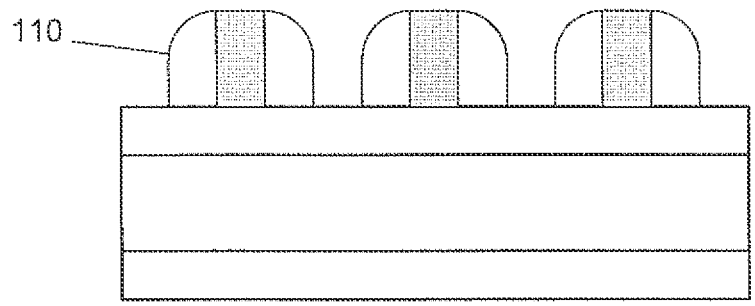
Figure 1C:
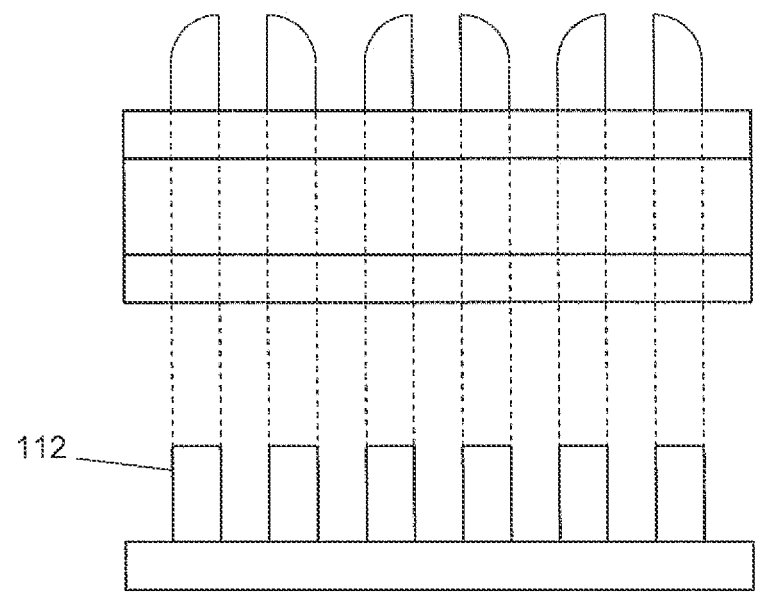
Figure 2A:
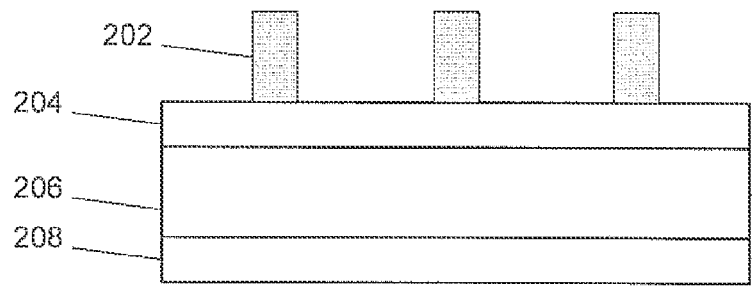
FIGS. 2A-2E illustrate schematic cross-sections of a semiconductor device according to the prior art exhibiting steps for negative tone double patterning.
Figure 2B:
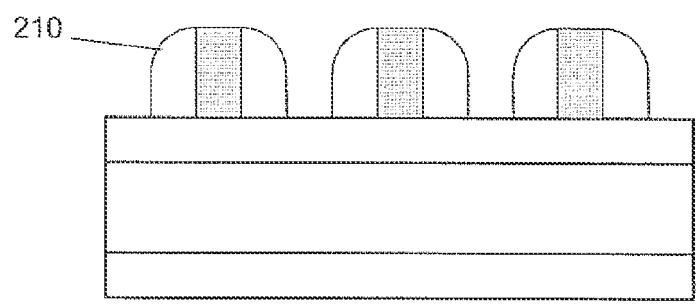
Figure 2C:
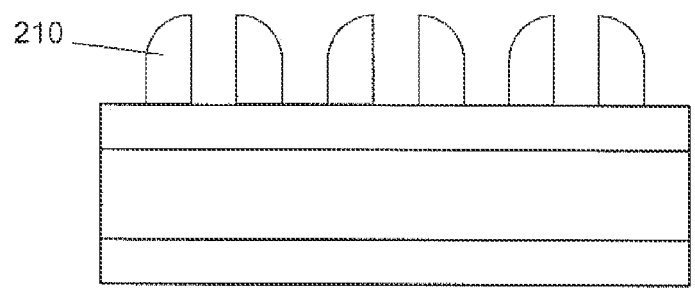
Figure 2D:
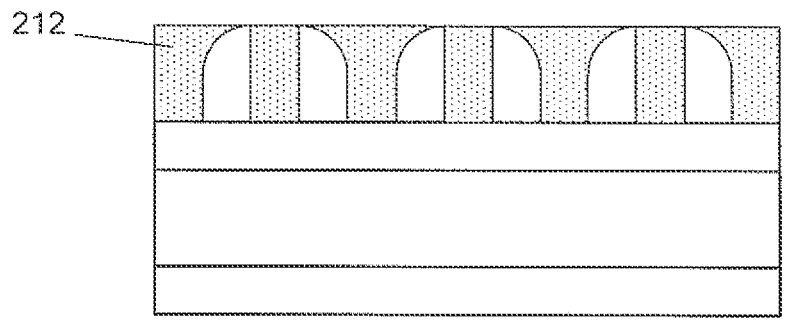
Figure 2E:
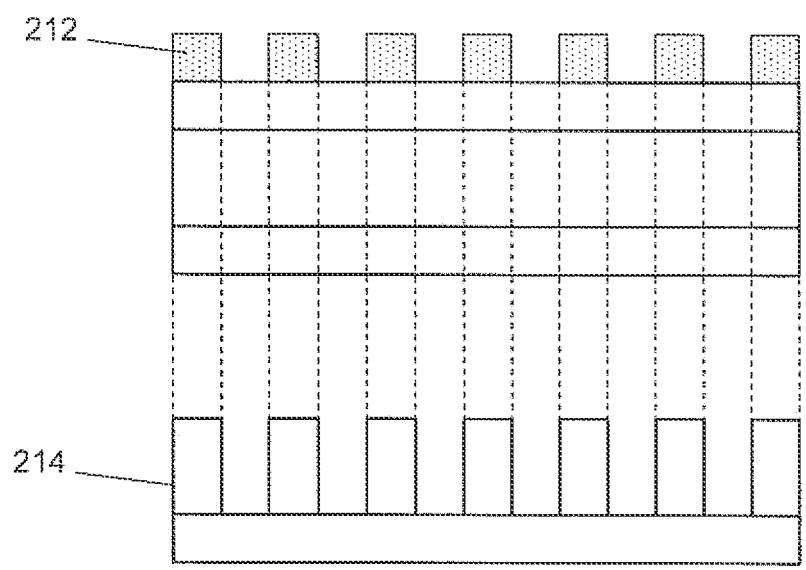

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" (refers to semiconductor packaging assembly or manufacturing process) or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in manufacturing semiconductor devices with aligned select-gate wordlines. Various embodiments of the present disclosure provide a positive-tone and a negative-tone double patterning approach that results in self-aligned select-gates that are a selected distance away from core cell wordlines.

FIGS. 4A(a) through 4G(b) illustrate the steps for positive tone double patterning to fabricate a pair of self-aligned select-gate wordlines between a plurality of core cell wordlines. FIG. 4A(a) is a top-down layout of a photoresist layer over a plurality of pattern transfer layers. Line A-A' is illustrated in FIG. 4A(b). As illustrated in FIGS. 4A(a) and 4A(b), a photoresist layer 402 overlays a plurality of pattern transfer layers 404, 406, which overlay a target layer 408. In one embodiment, the plurality of pattern transfer layers comprises a silicon oxynitride layer 404 and a hard mask 406. In one embodiment, the target layer 408 is a poly-oxide layer.

As further illustrated in FIG. 4A(a), the dimensions of the photoresist used to define the select-gate wordlines are adjusted according to a select-gate channel length target. As illustrated in FIG. 4A(a), portions of the photoresist are used to define the select-gate wordlines and other portions of the photoresist are used to define a plurality of core cell wordlines.

FIG. 4B(a) illustrates a top-down layout of the photoresist layer over a plurality of pattern transfer layers. Line A-A' is illustrated in FIG. 4B(b). As illustrated in FIGS. 4B(a) and 4B(b), a spacer 410 is placed around edges of the photoresist layer 402. As discussed in detail below, the spacers 410 will be used to define the core cell wordlines and the select-gate wordlines. In one embodiment, the spacer 410 is 32 nm thick.

FIG. 4C(a) illustrates a top-down layout of a spacer pattern over a plurality of pattern transfer layers. Line A-A' is illustrated in FIG. 4C(b). In FIGS. 4C(a) and 4C(b), the photoresist layer 402 has been removed. With the photo resist 402 removed, the spacer 410, illustrated in FIGS. 4C(a) and 4C(b), is a spacer pattern 410. As noted above, in one exemplary embodiment, the spacers 410 are each 32 nm thick.

FIG. 4D(a) illustrates a top-down layout of a trim mask overlaying a portion of the spacer pattern. Line A-A' is illustrated in FIG. 4D(b). In FIGS. 4D(a) and 4D(b), a trim mask 412 has been placed over a portion of the spacer pattern 410. As illustrated in FIG. 4D(a), portions of the spacer pattern 410 are not under the trim mask 412 and are therefore exposed.

FIG. 4E(a) illustrates a top-down layout of a spacer pattern 410 after the removal of the trim mask 412. FIG. 4E(a) also illustrates the removal of a portion of the spacer pattern 410. Line A-A' is illustrated in FIG. 4E(b). As illustrated in FIGS. 4E(a) and 4E(b), those portions of the spacer pattern 410 not under the trim mask 412 have been etched away. After the exposed portions of the spacer pattern 410 are etched, the trim mask 412 is removed. The remaining portions of the spacer pattern 410 will be used to define the core cell wordlines as well as the select-gate wordlines, as discussed in detail below.

FIG. 4F(a) illustrates a top-down layout of a spacer pattern 410 with the addition of a pad mask 414. FIG. 4F(a) also illustrates the placement of pads 416 for the core cell wordlines. Line A-A' is illustrated in FIG. 4F(b). As illustrated in FIGS. 4F(a) and 4F(b), a pad mask 414 is placed, overlying a portion of the spacer pattern 410 to define select-gate wordlines. Further, other portions of the pad mask are used to define pads 416 associated with each core cell wordline. In other words, the pad mask 414 and portions of the spacer pattern 410 define the select-gate wordlines, as illustrated below.

Figure 4G:
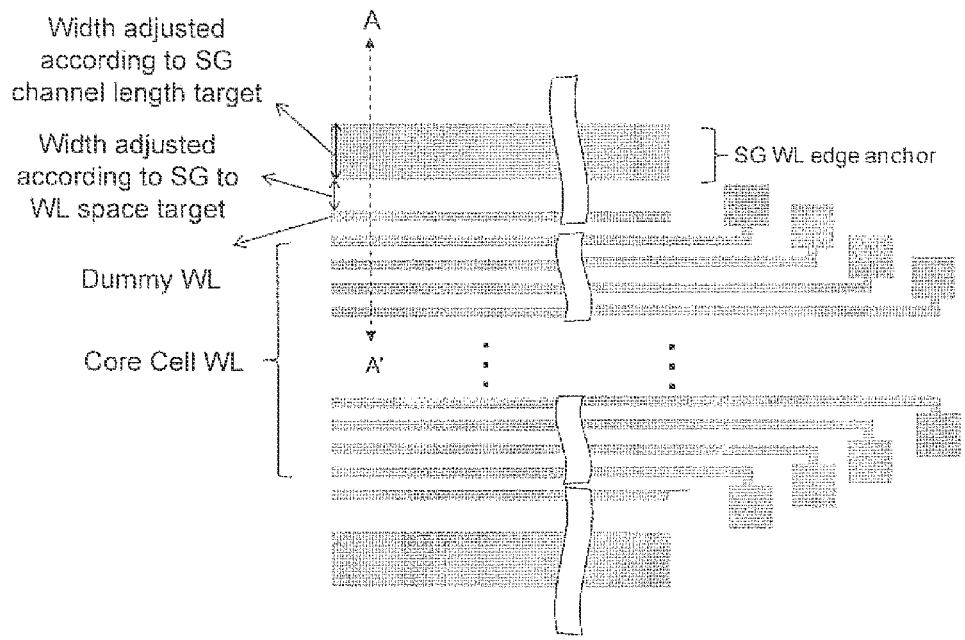
FIGS. 4A(a-b) through 4G(a-b) illustrate a top-down layout and schematic cross-section of a semiconductor device in accordance with an embodiment of the present invention.
Figure 4G:
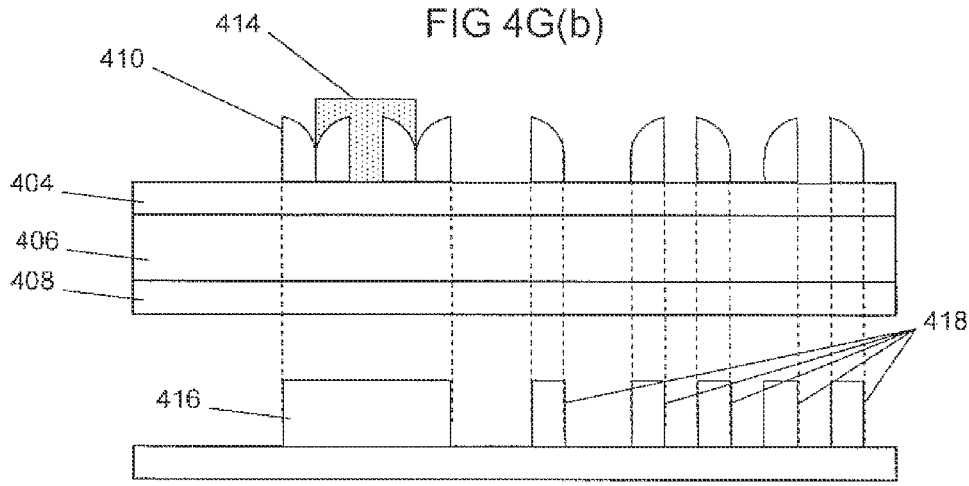

FIG. 4G(a) illustrates a top-down layout of a etch pattern for defining select-gate wordlines and a plurality of core cell wordlines. FIG. 4G(a) also illustrates that width of the select-gate wordline may be adjusted according to select-gate channel length target requirements. Further, FIG. 4G(a) also illustrates that the spacing between a select-gate wordline and a dummy wordline may be adjusted according to select-gate to core cell wordline spacing target requirements. Line A-A' is illustrated in FIG. 4G(b). As illustrated in FIG. 4G(b), the pad mask 414 and a portion of the spacer pattern 410 are used to define the select-gate wordline 416. As further illustrated in FIG. 4G(b), portions of the spacer pattern 410 are also used to define the core cell wordlines 418. The spacer pattern 410 and pad mask 414 define self-aligned select-gate wordlines 416 and core cell wordlines 418 with pads as the pattern transfer layers 404, 406 are etched to define the select-gate wordlines 416 and core cell wordlines 418 with pads that are to be formed in the target layer 408. In one embodiment, the target layer 408 forming the wordlines is a polyoxide. In one embodiment, other layers exist under the target layer 408. Additional layers include oxide/nitride/oxide (ONO) layers and a substrate layer. Other embodiments may contain other layers.

As illustrated in FIGS. 4G(a) and 4G(b), the end result of positive tone double patterning is a pair of self-aligned select-gate wordlines that are properly positioned on either side of a plurality of core cell wordlines. By forming the select-gate wordlines and the core cell wordlines simultaneously, the lateral positioning of the select-gate wordlines in relation to the core cell wordlines can be improved and prevent select-gate/core cell wordline interferences, and prevent the accidental overlay of a select-gate upon a core cell wordline. The end result is improved manufacturing efficiency and improved quality control.

Figure 5A:
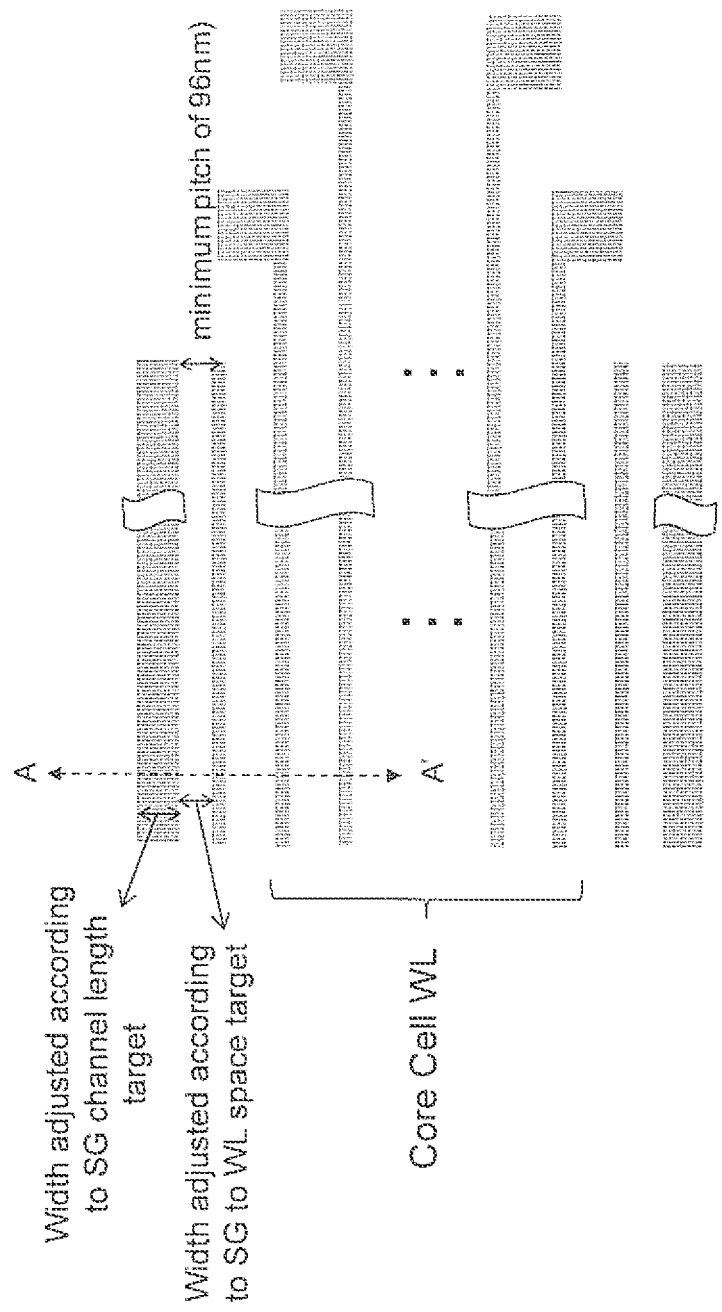
FIGS. 5A(a-b) through 5H(a-b) illustrate a top-down layout and schematic cross-section of a semiconductor device in accordance with an embodiment of the present invention.

FIGS. 5A(a) through 5H illustrate the steps for negative tone double patterning to fabricate a pair of self-aligned select-gate wordlines between a plurality of core cell wordlines. FIGS. 5A(a) through 5C(b) are similar to FIGS. 4A(a) through 4C(b). FIG. 5A(a) is a top-down layout of a photoresist layer over a plurality of pattern transfer layers. Line A-A' of FIG. 5A(a) is illustrated in FIG. 5A(b). As illustrated in FIGS. 5A(a) and 5A(b), a photoresist layer 502 overlays a plurality of pattern transfer layers 504, 506, which overlay a target layer 508. In one embodiment, the plurality of pattern transfer layers comprises a silicon oxynitride layer 504 and a hard mask 506. In one embodiment, the target layer 508 is a poly-oxide layer.

As further illustrated in FIG. 5A(a), the dimensions of the photoresist used to define the select-gate wordlines are adjusted according to a select-gate channel length target. As illustrated in FIG. 5A(a), portions of the photoresist are used to define the select-gate wordlines, and other portions of the photoresist are used to define a plurality of core cell wordlines.

FIG. 5B(a) illustrates a top-down layout of the photoresist layer over a plurality of pattern transfer layers. Line A-A' is illustrated in FIG. 5B(b). As illustrated in FIGS. 5B(a) and 5B(b), a spacer 510 is placed around the edges of the photoresist layer 502. As discussed in detail below, the spacers 510 will be used to define the wordlines and the select-gate wordlines. In one embodiment, the spacer 510 is 32 nm thick.

FIG. 5C(a) illustrates a top-down layout of a spacer pattern over a plurality of pattern transfer layers. Line A-A' is illustrated in FIG. 5C(b). In FIGS. 5C(a) and 5C(b), the photoresist layer 502 has been removed. With the photo resist 502 removed, the spacer 510, illustrated in FIGS. 5C(a) and 5C(b), is a spacer pattern 510. As noted above, in one exemplary embodiment, the spacers 510 are each 32 nm thick. FIG. 5C(b) illustrates that a portion 512 of the spacer pattern 510 will define the final space between a select-gate wordline and a first core cell wordline. This portion 512 of the spacer pattern 510 is limited to a maximum thickness of twice the spacer pattern thickness.

Figure 5D:
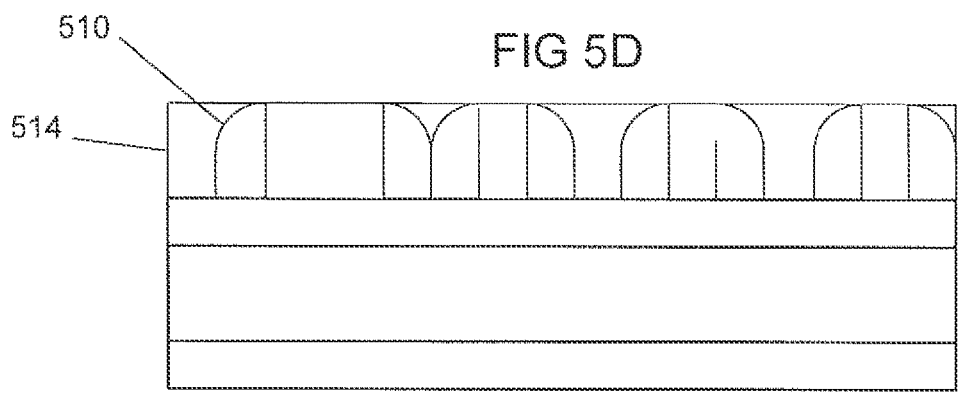

FIG. 5D illustrates a cross-section view of a spacer pattern 510 over a plurality of pattern transfer layers after the application of a spin-on-carbon (SOC) layer 514. The SOC layer 514 covers the entire spacer pattern 510. In one embodiment, the SOC layer 514 covers the entire wafer.

Figure 5E:
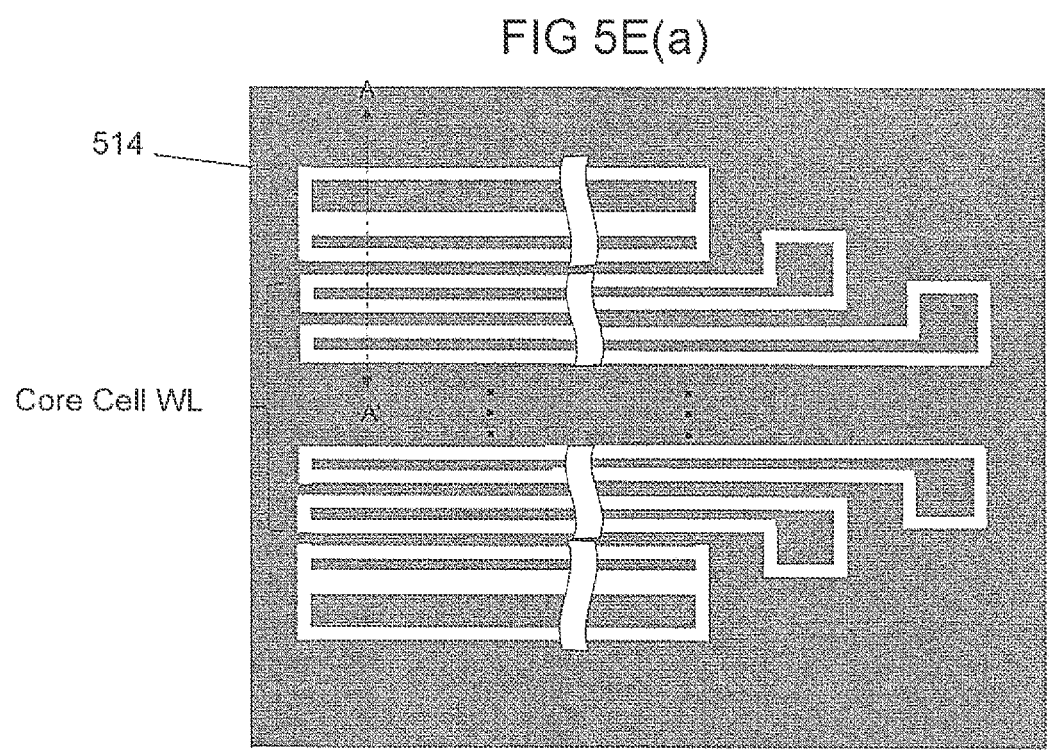
Figure 5E:
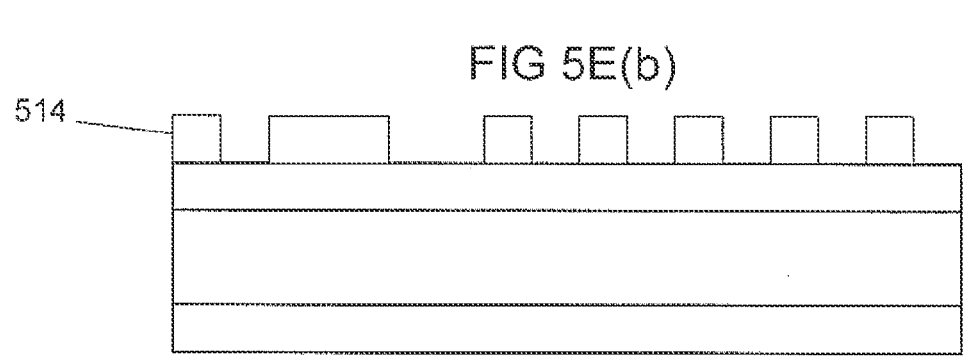

FIG. 5E(a) illustrates a top-down layout of an SOC layer over a plurality of pattern transfer layers after a spacer pattern has been removed. Line A-A' of FIG. 5E(a) is illustrated in FIG. 5E(b). In FIGS. 5E(a) and 5E(b), the spacer pattern 510 has been removed. With the removal of the spacer pattern 510, the SOC layer becomes an SOC pattern layer 514.

Figure 5F:
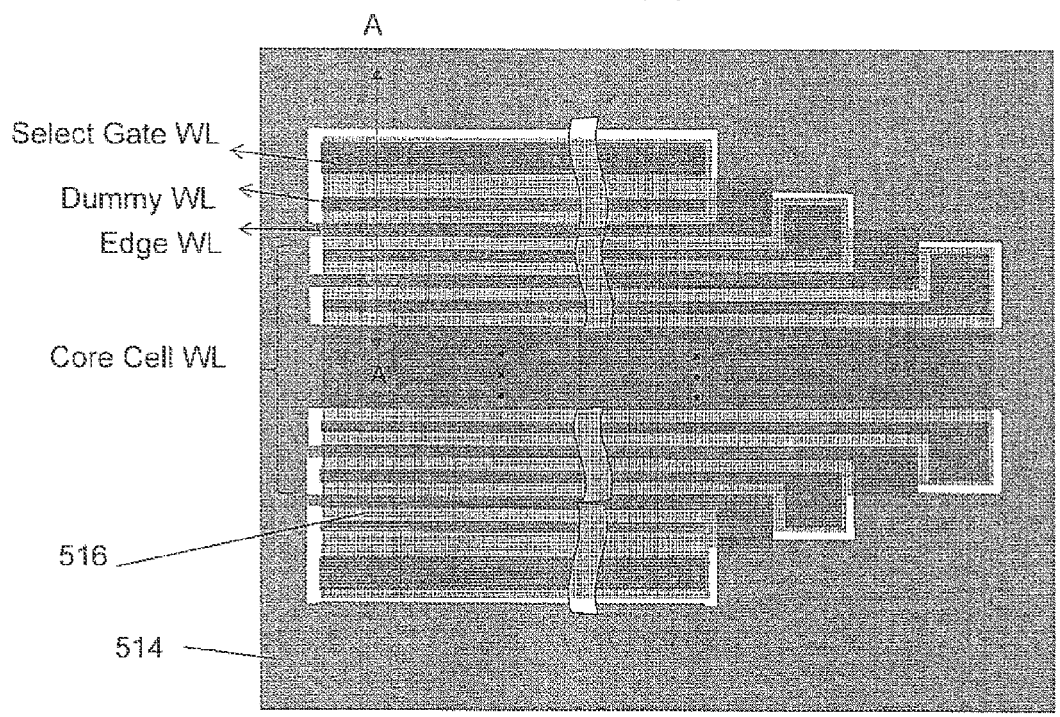
Figure 5F:
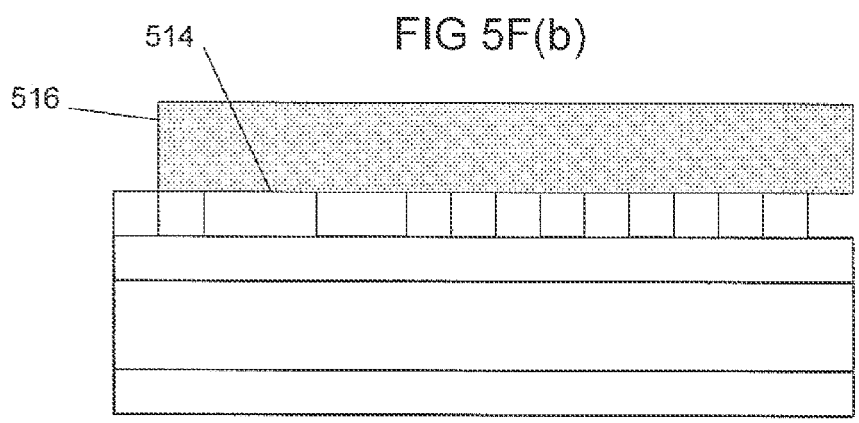

FIG. 5F(a) illustrates a top-down layout of an SOC pattern layer over a plurality of pattern transfer layers after the placement of a trim mask. Line A-A' of FIG. 5F(a) is illustrated in FIG. 5F(b). In FIGS. 5F(a) and 5F(b), a trim mask 516 is placed over a portion of the SOC pattern layer 514. As further illustrated in FIGS. 5G(a) and 5G(b), those portions of the SOC pattern layer 514 are etched away.

Figure 5G:
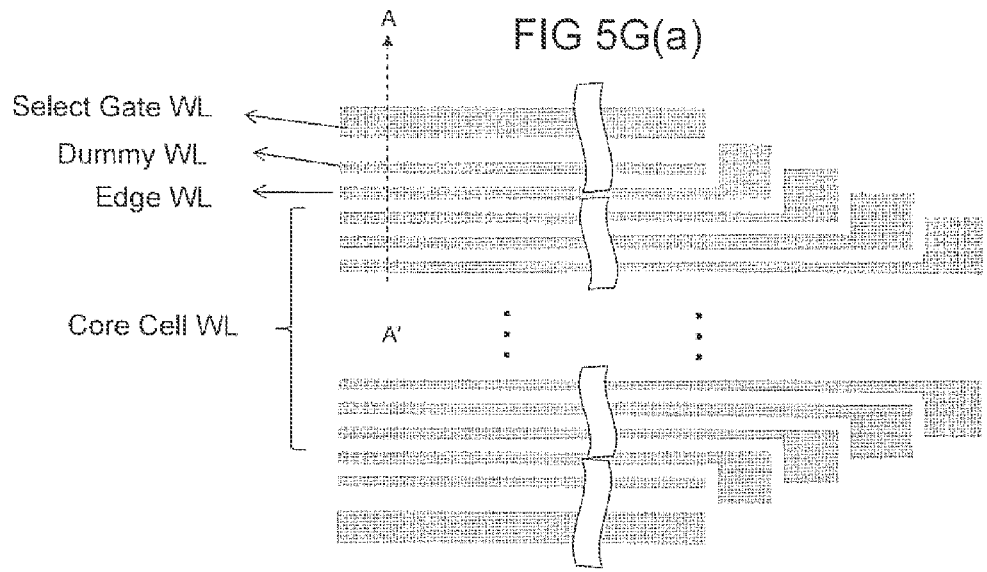
Figure 5G:
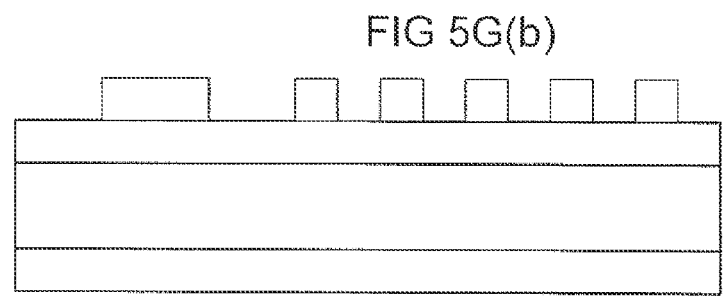

FIG. 5G(a) illustrates a top-down layout of an SOC pattern layer over a plurality of pattern transfer layers after a portion of the SOC pattern layer has been etched away. Line A-A' of FIG. 5G(a) is illustrated in FIG. 5G(b). FIGS. 5G(a) and 5G(b) illustrate that after a portion of the SOC pattern layer 514 has been etched away, the trim mask 516 is removed. As further illustrated in FIGS. 5G(a) and 5G(b), the remaining SOC pattern layer 514 defines each select-gate wordline and a plurality of core cell wordlines between the select-gate wordlines. FIG. 5G(a) also illustrates that the remaining SOC pattern layer 514 will also define a dummy wordline and the spacing between each select-gate wordline and its respective, adjacent dummy wordline. Note, that FIG. 5G(a) also illustrates that the first core cell wordline adjacent to the dummy wordline is also an edge wordline.

Figure 5H:
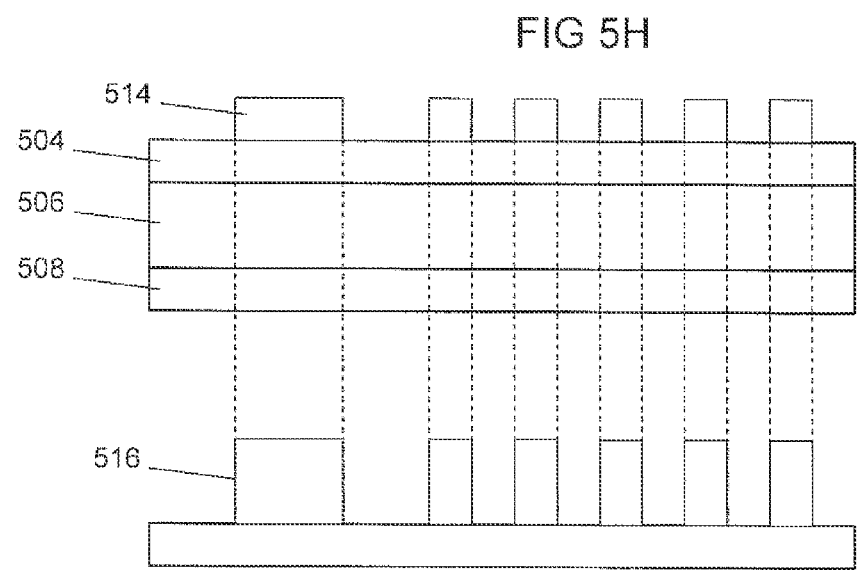

As illustrated in FIG. 5H, and illustrated in FIG. 5G(a), the remaining SOC layer pattern 514 is an etch pattern for defining the select-gate wordlines and the plurality of core cell wordlines. FIG. 5H illustrates how the pattern from the SOC layer pattern 514 is transferred through the pattern transfer layers 504, 506, to eventually be etched into target layer 508. FIG. 5H illustrates the etching of the final pattern 516 in a hard mask layer 506. This final etch pattern 506 is then etched into the target layer 508. In one embodiment, the target layer 508 forming the wordlines is a poly silicon. In one embodiment, other layers exist under the target layer 508. Additional layers include oxide/nitride/oxide (ONO) layers and a substrate layer. Other embodiments may contain other layers.

As illustrated in FIGS. 5G(a) and 4H, the end result of negative tone double patterning is a self-aligned select-gate wordline that is properly positioned on either side of a plurality of core cell wordlines. By forming the select-gate wordlines and the core cell wordlines simultaneously, the lateral positioning of the select-gate wordlines in relation to the core cell wordlines can be improved and prevent select-gate/core cell wordline interferences, and prevent the accidental overlay of a select-gate wordline upon a core cell wordline. The end result is improved manufacturing efficiency and improved quality control.

Figure 6:
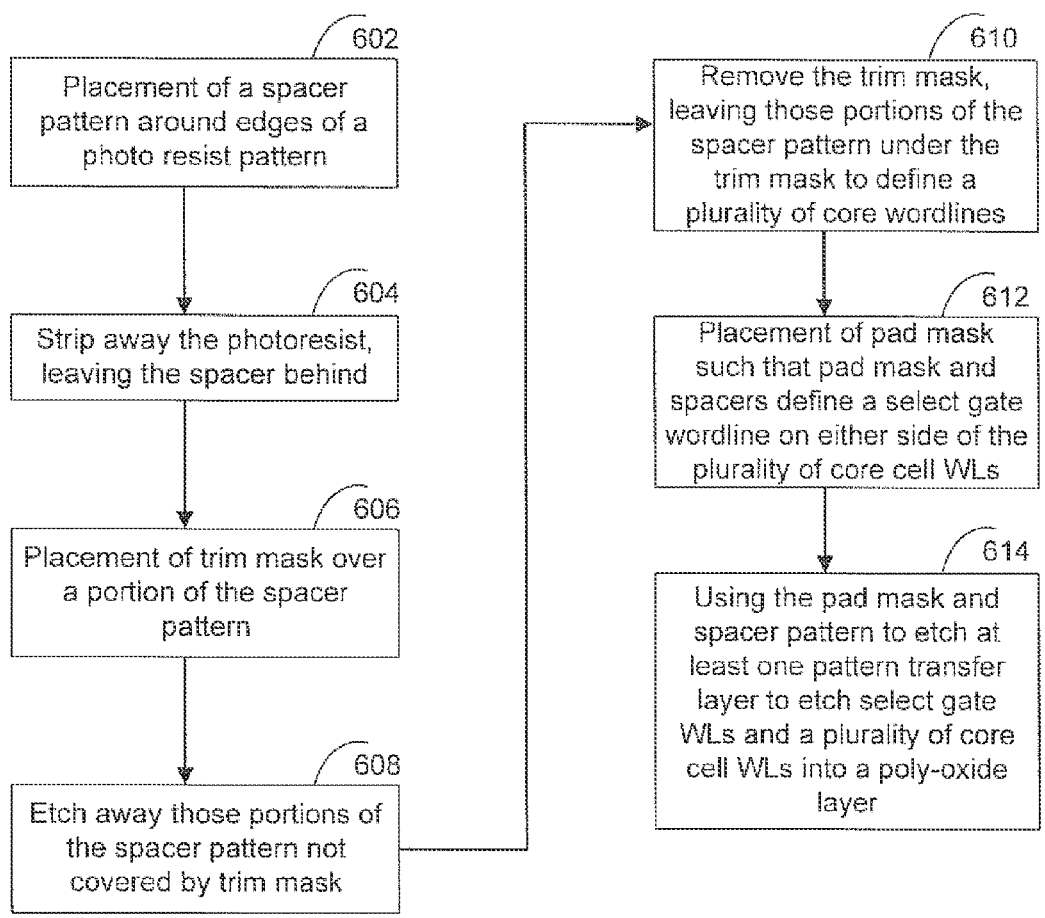
FIG. 6 illustrates a flow diagram, illustrating the steps to a method for positive tone double patterning in accordance with an embodiment of the present invention.

FIG. 6 is flow diagram, illustrating steps to a process for positive tone double patterning. The process begins in step 602 with the placement of a spacer around edges of a photoresist pattern. In one embodiment, the spacer is placed around edges of a layer of amorphous carbon layer, the amorphous carbon layer's pattern transferred from a previous photoresist pattern layer that was removed in an earlier step.

In step 604, the photoresist is stripped away, leaving the spacer layer behind. With the photoresist pattern layer removed, the spacer becomes a spacer pattern layer. In step 606 a trim mask is placed over a portion of the spacer pattern layer. In step 608, those portions of the spacer pattern layer not covered by the trim mask are etched away.

In step 610, the trim mask is removed, revealing the remaining portions of the spacer pattern layer. Those remaining portions of the spacer pattern layer now define a plurality of core wordlines. In step 612, the placement of a pad mask defines pads for each of the core cell wordlines. The placement of the pad mask over portions of the remaining spacer pattern layer define select-gate wordlines.

In step 612, using the pad mask and remaining spacer pattern, at least one pattern transfer layer is etched to form a pattern to define select-gate wordlines and a plurality of core cell wordlines that are etched into a target layer. In one embodiment, the final target layer is a poly silicon layer. In another embodiment, the at least one pattern transfer layer comprises a silicon oxynitride layer under the spacer pattern and then a hard mask layer under the silicon oxynitride layer.

Figure 7:
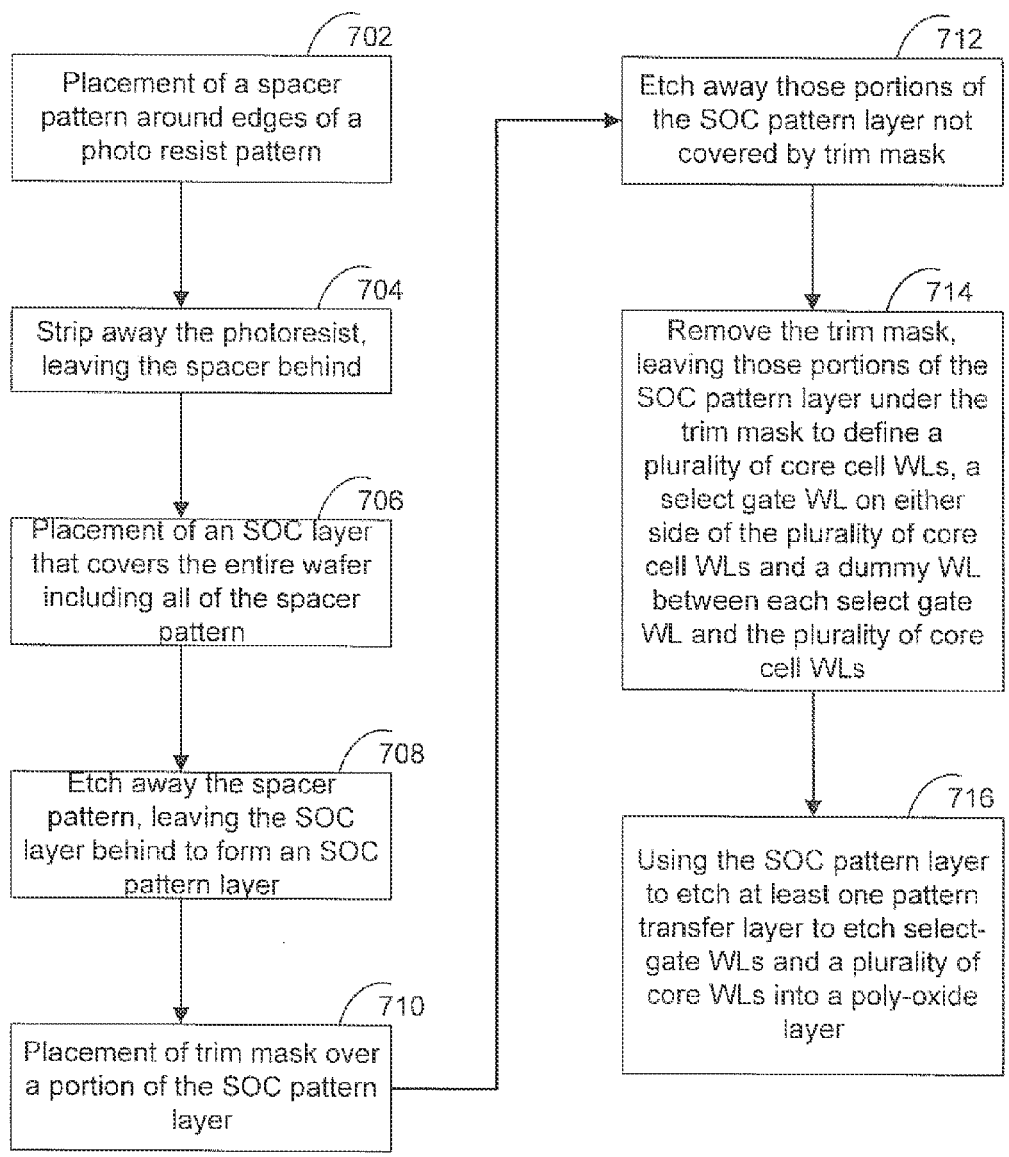
FIG. 7 illustrates a flow diagram, illustrating the steps to a method for negative tone double patterning in accordance with an embodiment of the present invention.

FIG. 7 is flow diagram, illustrating steps to a process for negative tone double patterning. The process begins in step 702 with the placement of a spacer around edges of a photoresist pattern. In one embodiment, the spacer is placed around edges of a layer of amorphous carbon layer, the amorphous carbon layer's pattern transferred from a previous photoresist pattern layer that was removed in an earlier step.

In step 704, the photoresist is stripped away, leaving the spacer layer behind. With the photoresist pattern layer removed, the spacer becomes a spacer pattern layer. In step 706, a spin-on-carbon (SOC) layer is deposited over the spacer pattern. In one embodiment, the SOC layer is deposited over the entire wafer.

In step 708, the spacer pattern is etched away. Etching away the spacer pattern leaves the SOC layer to form an SOC pattern layer defined by the now removed spacer pattern layer. In step 710, a trim mask is placed over a portion of the SOC pattern layer. In step 712, those portions of the SOC pattern layer not covered by the trim mask are etched away.

In step 714, the trim mask is removed. With the removal of the trim mask, the remaining portions of the SOC pattern layer are revealed. Those remaining portions of the SOC pattern layer will define a plurality of core wordlines, a select-gate wordline on either side of the plurality of wordlines and a dummy wordline between each select-gate wordline and the plurality of core cell wordlines when they are etched into a target layer.

In step 716, using the remaining SOC pattern layer as a template, at least one pattern transfer layer is etched to form a final pattern to define select-gate wordlines and a plurality of core cell wordlines as they are etched into a target layer. In one embodiment, the final target layer is a poly silicon layer. In another embodiment, the at least one pattern transfer layer comprises a silicon oxynitride layer under the spacer pattern and then a hard mask layer under the silicon oxynitride layer.

Benefits of using positive tone double patterning include flexibility in spacing between select-gate wordlines and core cell wordlines. Further, only a single immersion tool is needed. However, positive tone double patterning does require three masking and etching steps. Meanwhile, the benefits of using negative tone double patterning include a simpler, process requiring only two masks and litho etching steps. However, negative tone double patterning does result in less flexibility than positive tone double patterning in the spacing between select-gate wordlines and core cell wordlines. The maximum spacing possible between a select-gate wordline and a core cell wordline in negative tone double patterning is twice the spacer layer width, as illustrated and discussed above.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:
1. A method for double patterning, comprising:
placing a spacer pattern around edges of a photoresist pattern;
stripping away the photoresist pattern leaving the spacer pattern;
placing a trim mask over a portion of the spacer pattern;
etching away portions of the spacer pattern that are not covered by the trim mask;
removing the trim mask, wherein first remaining portions of the spacer pattern define a plurality of core wordlines;
placing a pad mask such that the pad mask and second remaining portions of the spacer pattern define a select gate wordline on either side of the plurality of core wordlines; and
etching through at least one pattern transfer layer using the pad mask and the first and second remaining portions of the spacer pattern to simultaneously etch the select gate wordlines and the plurality of core wordlines into a poly silicon layer.

2. The method for doubling patterning of claim 1, wherein the at least one pattern transfer layer comprises a silicon oxynitride layer over a hard mask layer.

3. The method for double patterning of claim 1, wherein the spacer pattern is placed around an amorphous carbon pattern transferred from the photoresist pattern.

4. The method for double patterning of claim 1, wherein the spacer pattern is formed from one of an oxide and an amorphous carbon layer.

5. The method for double patterning of claim 1, wherein the pad mask further defines pads.

6. The method for double patterning of claim 1, wherein distances between each of the select gate wordlines and the plurality of core wordlines are equal and set according to a target spacing.

7. The method for double patterning of claim 1, wherein the spacer pattern is 32 nm thick.

8. A method for double patterning, comprising:
placing a spacer pattern around edges of a photoresist pattern;
stripping away the photoresist pattern leaving the spacer pattern;
placing a spin-on-carbon (SOC) layer over the spacer pattern;
etching away the spacer pattern, such that the SOC layer remains to form an SOC pattern;
placing a trim mask over a portion of the SOC pattern;
etching away portions of the SOC pattern not covered by the trim mask;
removing the trim mask, wherein first remaining portions of the SOC pattern define a plurality of core wordlines, wherein second remaining portions of the SOC pattern define a select gate wordline on either side of the plurality of wordlines, wherein the first remaining portions of the SOC pattern also define a dummy wordline between each of the select gate wordlines and the plurality of core wordlines; and
etching through at least one pattern transfer layer using the first and second remaining portions of the SOC pattern to simultaneously etch the select gate wordlines, the dummy wordlines, and the plurality of core wordlines into a poly silicon layer.

9. The method for doubling patterning of claim 8, wherein the at least one pattern transfer layer comprises a silicon oxynitride layer over a hard mask layer.

10. The method for double patterning of claim 8, wherein the spacer pattern is placed around an amorphous carbon pattern transferred from the photoresist pattern.

11. The method for double patterning of claim 8, wherein the spacer pattern is formed from one of an oxide and an amorphous carbon layer.

12. The method for double patterning of claim 8, wherein the spacer pattern is 32 nm thick.

13. The method for double patterning of claim 8, wherein distances between each select gate wordline and the dummy wordlines are equal and set according to a target spacing.

14. The method for double patterning of claim 13, wherein a distance between a select gate wordline and a dummy wordline is equal to twice a spacer pattern thickness.

15. The method for double patterning of claim 13, wherein a distance between a select gate wordline and a dummy wordline is no more than twice a spacer pattern thickness.

* * * * *